United States Patent
Alvarado et al.

(10) Patent No.: US 9,209,110 B2
(45) Date of Patent: Dec. 8, 2015

(54) INTEGRATED DEVICE COMPRISING WIRES AS VIAS IN AN ENCAPSULATION LAYER

(71) Applicant: QUALCOMM Incorporated, San Diego, CA (US)

(72) Inventors: Reynante Tamunan Alvarado, San Diego, CA (US); Lizabeth Ann Keser, San Diego, CA (US); Steve Joseph Bezuk, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/272,494

(22) Filed: May 7, 2014

(65) Prior Publication Data

US 2015/0325496 A1    Nov. 12, 2015

(51) Int. Cl.
| | |
|---|---|
| *H01L 23/04* | (2006.01) |
| *H01L 23/48* | (2006.01) |
| *H01L 21/768* | (2006.01) |
| *H01L 25/065* | (2006.01) |
| *H01L 25/00* | (2006.01) |
| *H01L 21/56* | (2006.01) |
| *H01L 23/31* | (2006.01) |

(52) U.S. Cl.
CPC .............. *H01L 23/481* (2013.01); *H01L 21/56* (2013.01); *H01L 21/76897* (2013.01); *H01L 23/3135* (2013.01); *H01L 25/0655* (2013.01); *H01L 25/50* (2013.01)

(58) Field of Classification Search
CPC ............ H01L 23/481; H01L 23/49827; H01L 23/3121; H01L 23/315; H01L 24/44; H01L 25/50

USPC .................................................. 257/698, 774
See application file for complete search history.

(56) References Cited

U.S. PATENT DOCUMENTS

| | | |
|---|---|---|
| 5,371,654 A | 12/1994 | Beaman et al. |
| 8,404,520 B1 | 3/2013 | Chau et al. |
| 2006/0108676 A1 | 5/2006 | Punzalan et al. |
| 2008/0315396 A1 | 12/2008 | Kuhlman et al. |

(Continued)

FOREIGN PATENT DOCUMENTS

WO    WO-2014107301 A1    7/2014

OTHER PUBLICATIONS

International Search Report and Written Opinion—PCT/US2015/026707—ISA/EPO—Sep. 1, 2015.

*Primary Examiner* — Tu-Tu Ho
(74) *Attorney, Agent, or Firm* — Loza & Loza, LLP

(57) ABSTRACT

Some novel features pertain to an integrated device that includes a substrate, a first die coupled to the substrate, a first encapsulation layer coupled to the substrate and the first die, and a second encapsulation layer in the first encapsulation layer. The second encapsulation layer includes a set of wires configured to operate as vias. In some implementations, the integrated device includes a set of vias in the first encapsulation layer. In some implementations, the integrated device further includes a second die coupled to the substrate. In some implementations, the second encapsulation layer is positioned between the first die and the second die. In some implementations, the integrated device further includes a cavity in the first encapsulation layer, where the second encapsulation layer is positioned in the cavity. In some implementations, the cavity has a wall that is non-vertical. In some implementations, at least one of the wires is non-vertical.

27 Claims, 12 Drawing Sheets

(56) References Cited

U.S. PATENT DOCUMENTS

| | | |
|---|---|---|
| 2011/0316156 A1 | 12/2011 | Pagaila et al. |
| 2013/0075926 A1 | 3/2013 | Bae et al. |
| 2013/0168858 A1* | 7/2013 | Ramasamy et al. .......... 257/738 |
| 2013/0256875 A1 | 10/2013 | Chen et al. |
| 2013/0299973 A1 | 11/2013 | Choi et al. |
| 2014/0035935 A1* | 2/2014 | Shenoy et al. ................ 345/501 |

* cited by examiner

INTEGRATED DEVICE COMPRISING WIRES AS VIAS IN AN ENCAPSULATION LAYER

BACKGROUND

1. Field

Various features relate to an integrated device that includes wires as vias in an encapsulation layer.

2. Background

FIG. 1 illustrates a first package 102 being coupled to a second package 104. The first package 102 includes a first substrate 106, a first die (e.g., chip) 108, a mold 110, a first set of solder balls 116, and a first set of interconnects 118, and a third set of solder balls 126. The first substrate 106 may include traces and/or vias (both of which are not shown). The second package 104 includes a second substrate 105, a second die 107, a third die 109, a second set of solder balls 115, a first set of wire bonds 117, and a second set of wire bonds 119. The second substrate 105 may include traces and/or vias (both of which are not shown). The second package 104 is positioned above the first package 102.

The first die 108 is coupled to a first surface (e.g., top surface) of the first substrate 106 through the first set of interconnects 118. The mold 110 encapsulates the first die 108 and the first set of interconnects 118. The first set of solder balls 116 is coupled to a second surface (e.g., bottom surface) of the first substrate 106. The third set of solder balls 126 is coupled to the first surface (e.g., top surface) of the first substrate 106. The third set of solder balls 126 is surrounded by the mold 110. The first substrate 106 includes a set of traces and/or vias that may electrically connect to the first die 108 and/or the first set of solder balls 116.

The second die 107 and the third die 109 are coupled to a first surface (e.g., top surface) of the second substrate 105. The second die 107 is electrically coupled to the traces and/or vias of the second substrate 105 through the first set of wire bonds 117. The third die 109 is electrically coupled to the traces and/or vias of the second substrate 105 through the second set of wire bonds 119. The second set of solder balls 115 is coupled to a second surface (e.g., bottom surface) of the second substrate 105.

FIG. 2 illustrates a conventional package on package (PoP) integrated device. As shown in FIG. 2, the integrated device 200 includes the first package 102 and the second package 104 of FIG. 1. As shown in FIG. 2, when the first package 102 is coupled to the second package 104, the second set of solder balls 115 of the second package 104 is coupled to the third set of interconnects 126 of the first package 102.

One drawback of the package on package configuration shown in FIGS. 1 and 2 is that the spacing between the solder balls is too large for the needs and/or requirements of mobile computing device. In particular, there is a constant need to reduce the size of integrated devices, especially integrated device that are going to be implemented in mobiles devices. Moreover, the process of fabricating the PoP configuration can be complicated and costly.

Another drawback of the package on package (PoP) configuration shown in FIGS. 1 and 2 is that it creates an integrated device with a form factor that may be too large for the needs of mobile computing devices. That is, the PoP configuration shown in FIG. 2 may be too thick and/or have a surface area that is too large to meet the needs and/or requirements of mobile computing devices.

Therefore, there is a need for a cost effective integrated package that has an improved form factor (e.g., smaller, narrower, thinner). Ideally, such an integrated package will provide higher density connections, as well being more cost effective (e.g., cheaper) to fabricate than current integrated packages.

SUMMARY

Various features, apparatus and methods described herein provide that includes wires as vias in an encapsulation layer.

A first example provides an integrated device that includes a substrate, a first die coupled to the substrate, a first encapsulation layer coupled to the substrate and the first die, and a second encapsulation layer in the first encapsulation layer. The second encapsulation layer includes a set of wires configured to operate as vias.

According to an aspect, the integrated device includes a set of vias in the first encapsulation layer.

According to one aspect, the integrated device includes a second die coupled to the substrate. In some implementations, the second encapsulation layer is positioned between the first die and the second die.

According to an aspect, the integrated device includes a cavity in the first encapsulation layer, where the second encapsulation layer is positioned in the cavity. In some implementations, the cavity has a wall that is non-vertical.

According to one aspect, at least one of the wires is non-vertical.

According to an aspect, at least one of the wires is free of a wire ball.

According to one aspect, the integrated device includes one of at least a package device, and/or a package-on-package (PoP) device.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a method for providing an integrated device. The method forms a substrate. The method couples a first die to the substrate. The method forms a first encapsulation layer on the substrate and the first die. The method also forms a second encapsulation layer in the first encapsulation layer. The second encapsulation layer includes a set of wires configured to operate as vias.

According to an aspect, the method forms a set of vias in the first encapsulation layer.

According to one aspect, the method couples a second die to the substrate. In some implementations, the second encapsulation layer is positioned between the first die and the second die.

According to an aspect, the method forms a cavity in the first encapsulation layer, where forming the second encapsulation layer includes positioning the second encapsulation layer in the cavity. In some implementations, the cavity has a wall that is non-vertical.

According to one aspect, where at least one of the wires is non-vertical.

According to an aspect, where at least one of the wires is free of a wire ball.

According to one aspect, the integrated device includes one of at least a package device, and/or a package-on-package (PoP) device.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

Figure 8A:
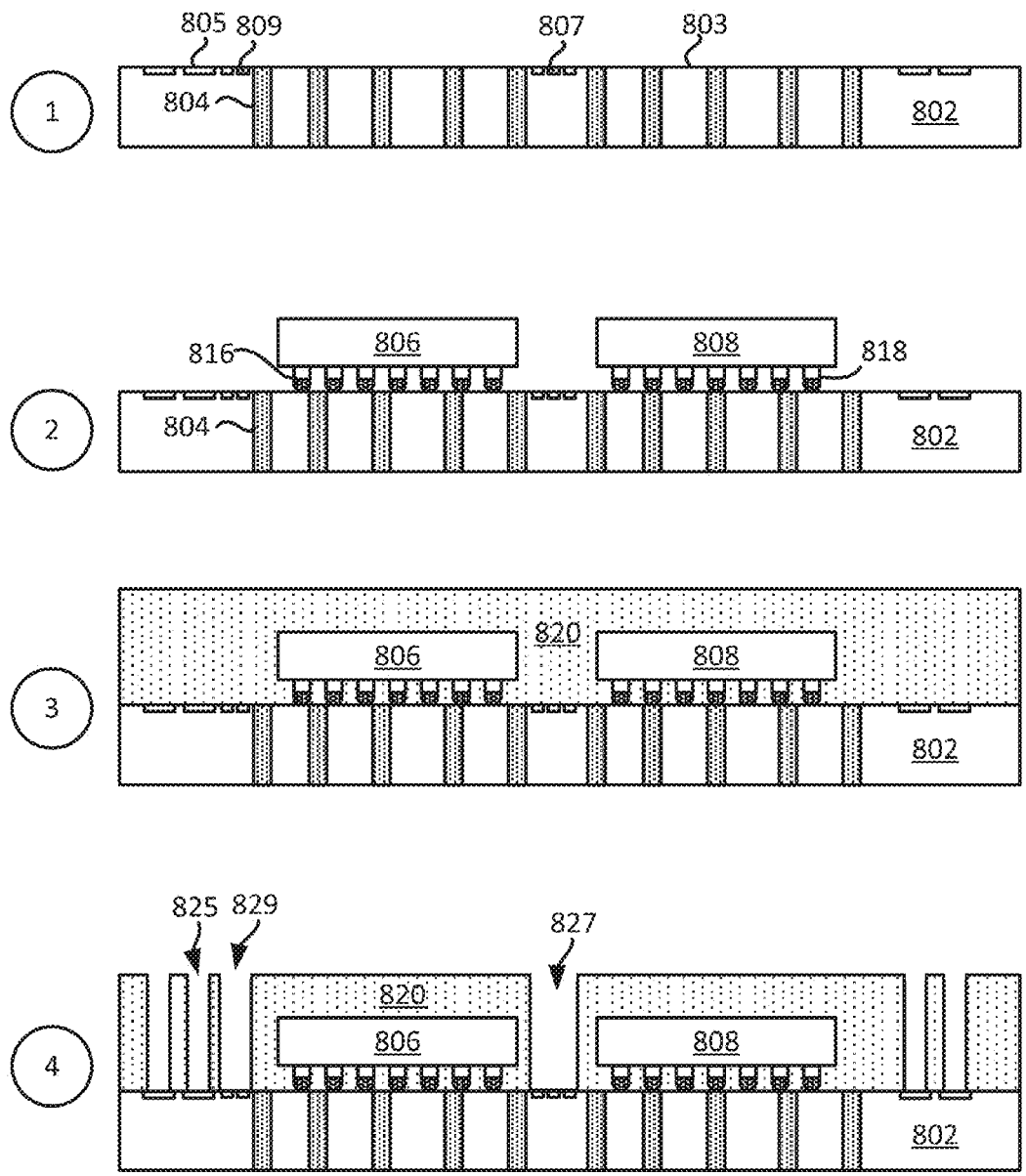
Figure 8B:
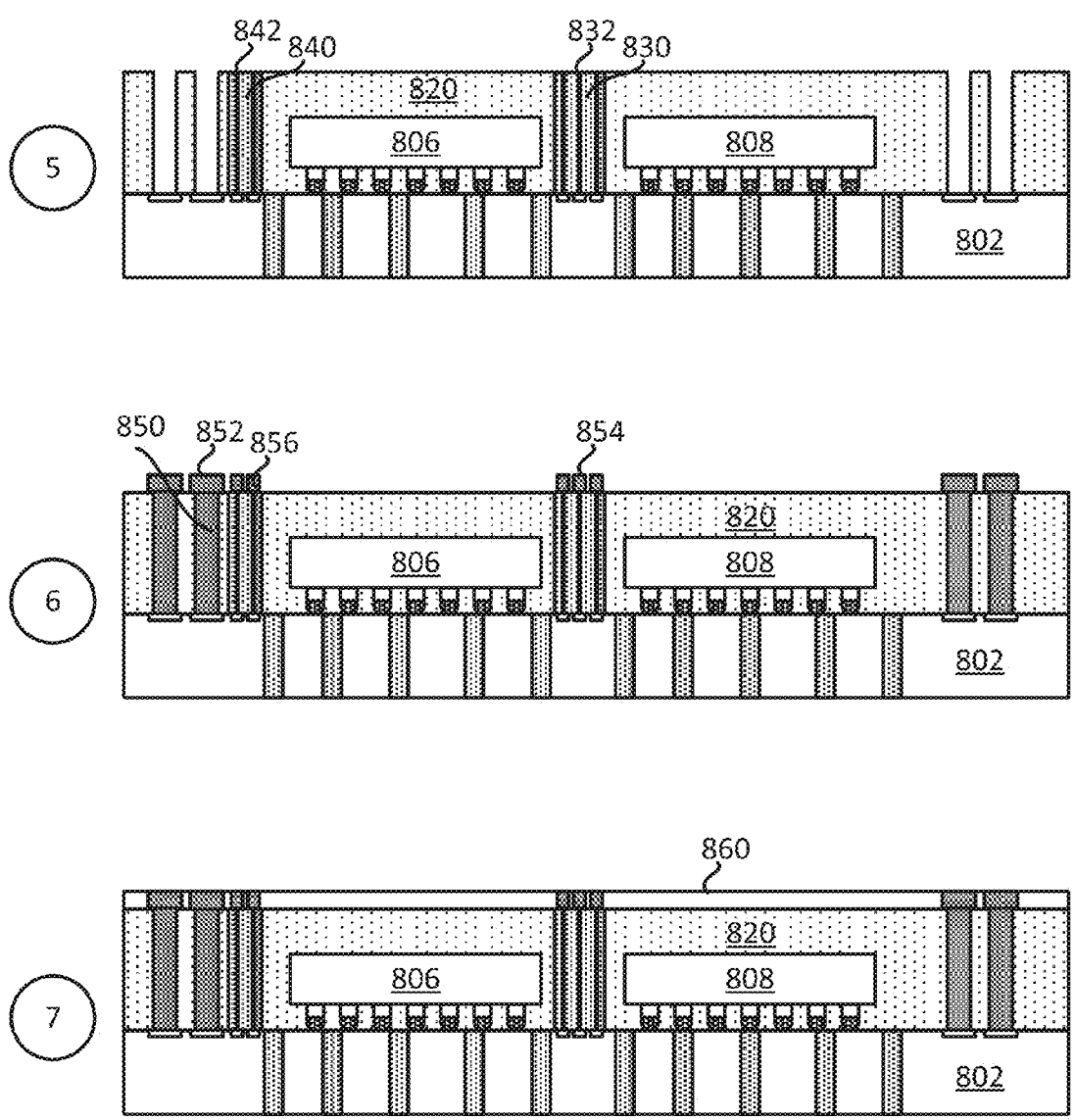
Figure 8C:
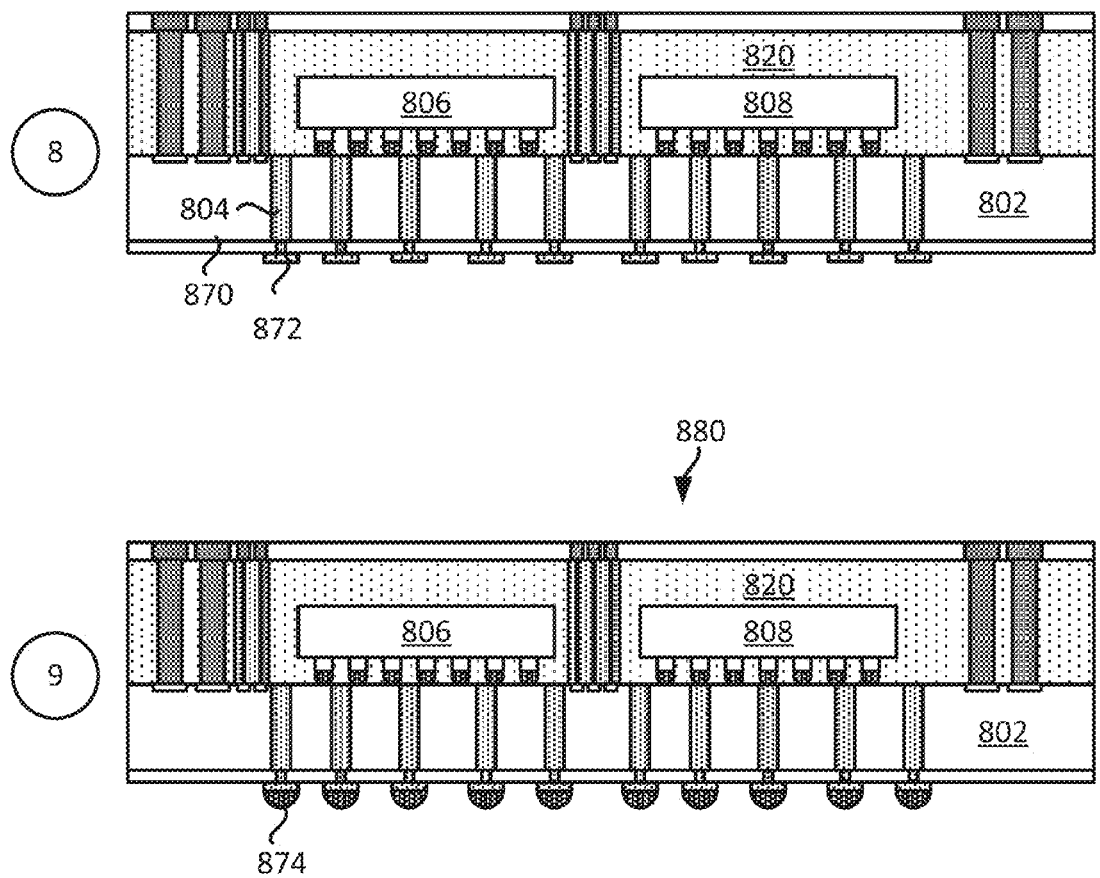

FIG. 8 (comprising FIGS. 8A, 8B, and 8C) illustrates an exemplary sequence for providing/fabricating an integrated device that includes wires in an encapsulation layer.

Figure 9:
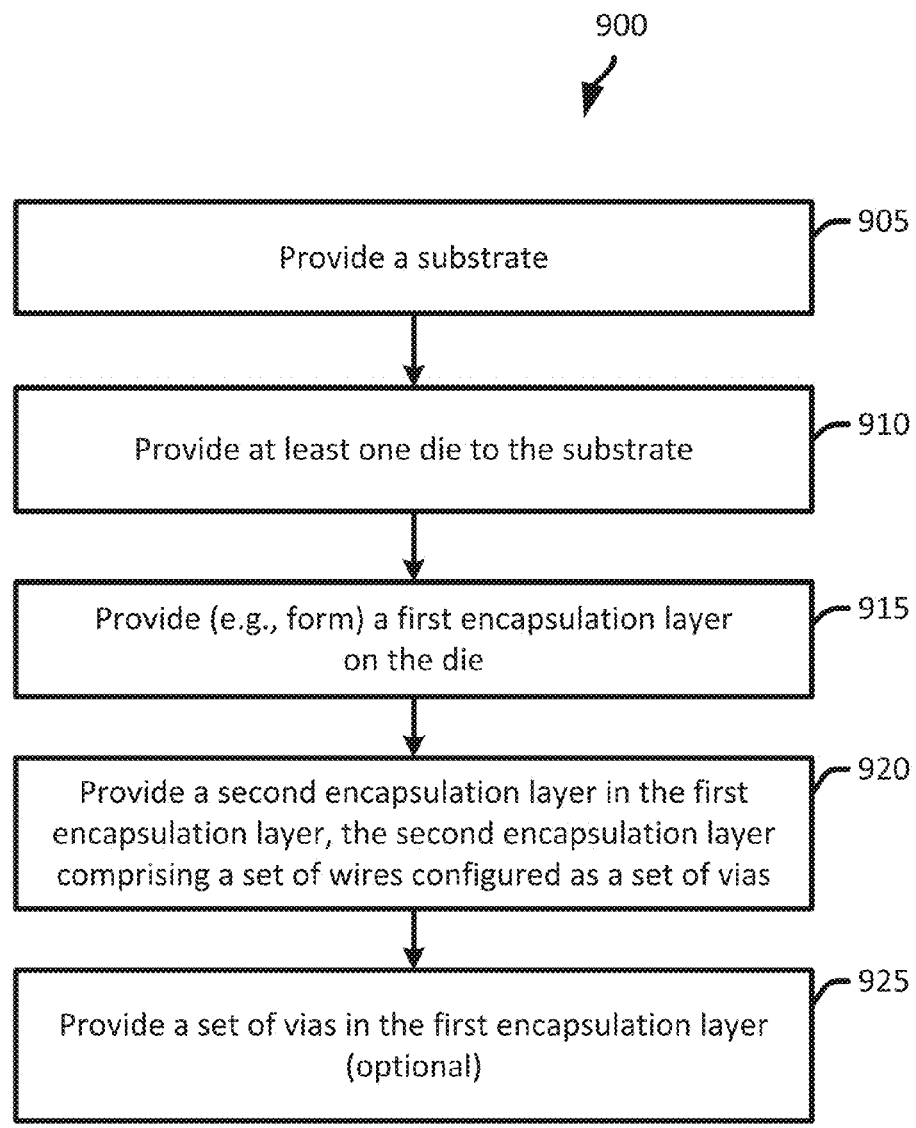

FIG. 9 illustrates a flow diagram of a method for providing/fabricating an integrated device that includes wires in an encapsulation layer.

Figure 10:
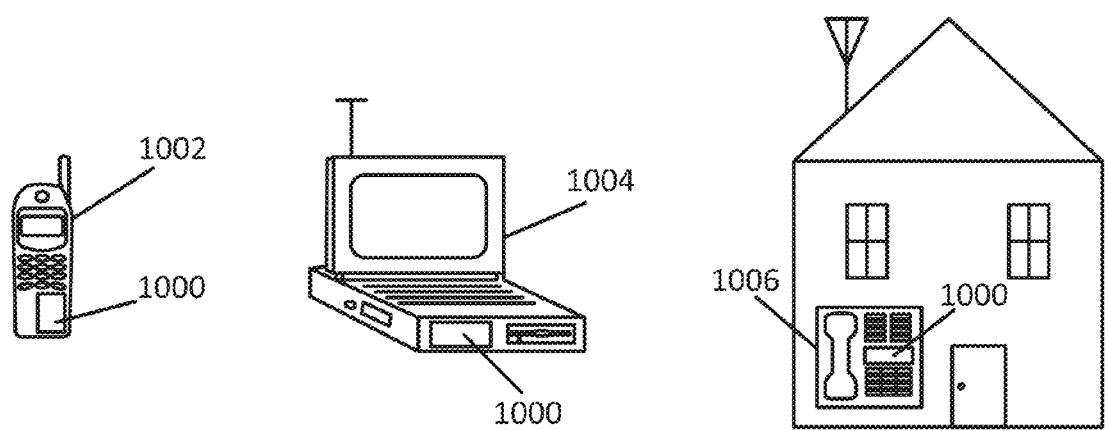

FIG. 10 illustrates various electronic devices that may integrate an integrated device, a semiconductor device, a die, an integrated circuit and/or PCB described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., package, package-on-package) that includes a substrate, a first die coupled to the substrate, a first encapsulation layer coupled to the substrate and the first die, and a second encapsulation layer in the first encapsulation layer. The second encapsulation layer includes a set of wires configured to operate as vias. In some implementations, the integrated device further includes a set of vias in the first encapsulation layer. In some implementations, the integrated device further includes a second die coupled to the substrate. In some implementations, the second encapsulation layer is positioned between the first die and the second die. In some implementations, the integrated device further includes a cavity in the first encapsulation layer, where the second encapsulation layer is positioned in the cavity. In some implementations, the cavity has a wall that is non-vertical. In some implementations, at least one of the wires is non-vertical. In some implementations, at least one of the wires is free of a wire ball.

Figure 1:
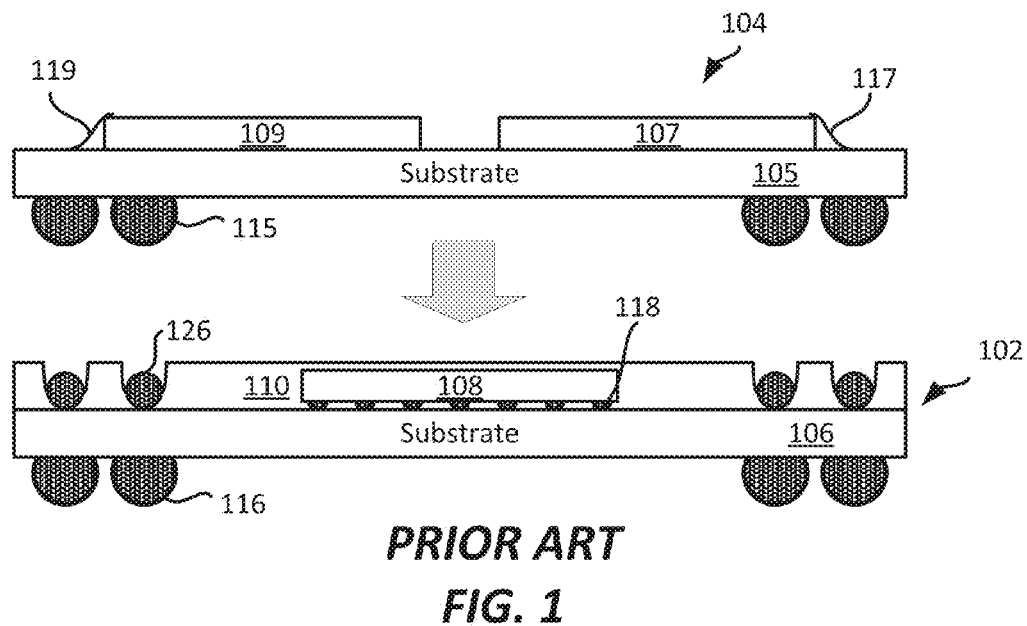
FIG. 1 illustrates a profile view of a first package being coupled to a second package.
Figure 2:
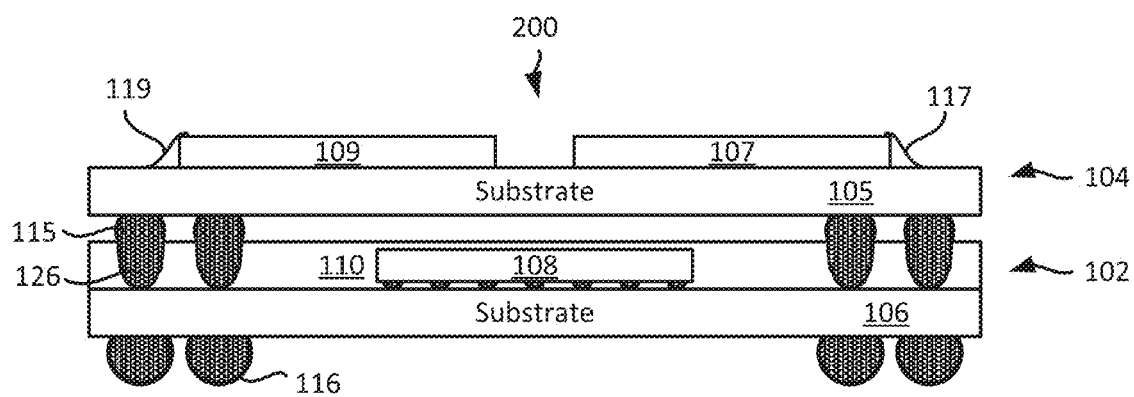
FIG. 2 illustrates a conventional package-on-package (PoP) device.
Figure 3:
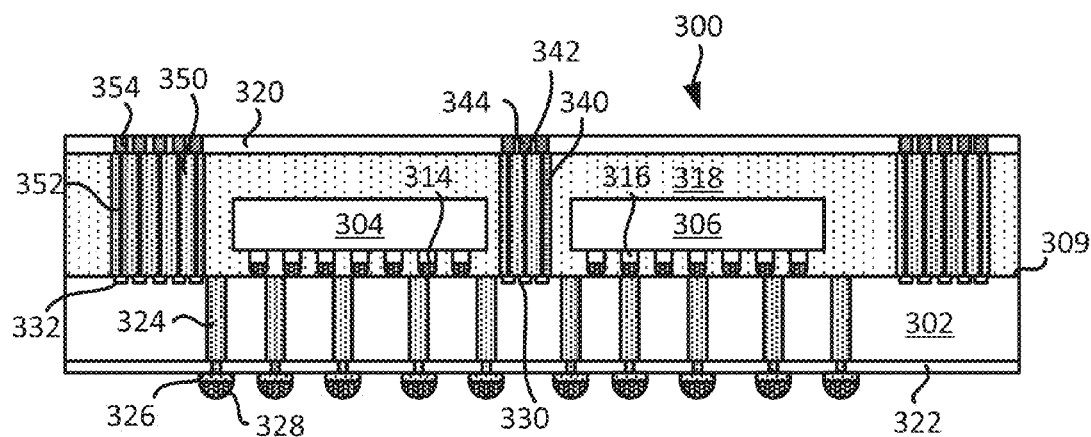
FIG. 3 illustrates an example of an integrated device that includes wires in an encapsulation layer, where the wires are configured to operate as vias.

Exemplary Integrated Device that Includes Wires as Vias Traversing an Encapsulation Layer FIG. 3 illustrates an integrated package device 300 that includes wires as vias in an encapsulation layer. In some implementations, the integrated package device 300 is a package in a package on package (PoP) device. As shown in FIG. 3, the integrated package device 300 includes a substrate 302, a first die 304, a second die 306, a first set of interconnects 314, a second set of interconnects 316, a first encapsulation layer 318, a first dielectric layer 320, a second dielectric layer 322, a set of through substrate vias (TSVs) 324, a third set of interconnects 326, a set of solder balls 328, a first set of pads 330, a second set of pads 332, a second encapsulation layer 340, a first set of wires 342, a third set of pads 344, a third encapsulation layer 350, a second set of wires 352, and a fourth set of pads 346. Although not shown for the purpose of clarity, the substrate 302 may include a set of interconnects (e.g., traces and vias). The set of interconnects may couple to other interconnects, such as the second set of pads 332 and/or the first set of interconnects 314 in some implementations.

The first die 304 is coupled the substrate 302 through the first set of interconnects 314 (e.g., first bump, first pillar interconnect, first solder). The second die 306 is coupled the substrate 302 through the second set of interconnects 316 (e.g., second bump, second pillar interconnect, second solder). The first encapsulation layer 318 covers the first and second dies 304 and 306.

As further shown in FIG. 3, the second encapsulation layer 340 and the third encapsulation layer 350 are located in the first encapsulation layer 318. In some implementations, the second encapsulation layer 340 and the third encapsulation layer 350 traverse the first encapsulation layer 318. The second encapsulation layer 340 includes a first set of wires 342. The third encapsulation layer 350 includes a second set of wires 352. In some implementations, the first set of wires 342 and the second set of wires 352 are wire bonds. Different implementations may use similar or different materials for the encapsulation layers (e.g., encapsulation layers 318, 340, 350). In some implementations, an encapsulation layer may include one of at least a mold, a fill, and/or a polymer material.

The first set of wires 342 is coupled to the first set of pads 330. The first set of pads 330 is located in the substrate 302. In some implementations, the first set of pads 330 may be located on the surface of the substrate 302. In some implementations, the first set of pads 330 may be located in the first encapsulation layer 318. The second set of wires 352 is coupled to the second set of pads 332. In some implementations, the set of wires 342 and/or 352 may be coupled to the set of pads 330 and/or 332 through a screen printing solder past on the set of pads 330 and/or 332. The second set of pads 332 is located in the substrate 302. In some implementations, the second set of pads 332 may be located on the surface of the substrate 302. In some implementations, the second set of pads 332 may be located in the first encapsulation layer 318.

In some implementations, the first set of pads 330 and/or the second set of pads 332 is coupled to at least one of the set of TSVs 324. In some implementations, at least one of the TSV from the set of TSVs 324 may be coupled to the third set of interconnects 326. At least one interconnect from the third set of interconnects 326 may be coupled to a solder ball from the set of solder balls 328. The second dielectric layer 322 is coupled to a surface (e.g., bottom surface) of the substrate 302. In some implementations, the third set of interconnects 326 may traverse the second dielectric layer 322.

The first dielectric layer 320 is coupled to a surface of the first encapsulation layer 318. The first dielectric layer 320 includes the third set of pads 344 and the fourth set of pads 354. The third set of pads 344 is coupled to the first set of wires 342. The fourth set of pads 354 is coupled to the second set of wires 352.

In some implementations, a dielectric layer 309 is coupled (e.g., formed) on the first surface of the substrate 302. In some implementations, the encapsulation layer 318 is coupled to the dielectric layer 309. In some implementations, the integrated package device 300 is a package in a package-on-package (PoP) device.

One advantage of implementing wires as vias in an encapsulation layer is the ability to provide interconnects that have spacing that are smaller than the spacing of conventional vias. Wires have narrower dimensions (e.g., narrower width) than conventional vias, thus wires provide higher density interconnects than conventional vias. In addition, the implementations of wires in an encapsulation layer that is different than the encapsulation layer (e.g., encapsulation in encapsulation) of an integrated device (e.g., package) provides interconnects that are closer (e.g., nearer) to a die than conventional vias. For example, the use of the first set wires 342 in the second encapsulation layer 340 allows interconnects (e.g., vias) to be placed between dies, when conventional vias would not be able to do so. In some implementations, the minimum spacing between wires are about at least 20 microns (µm). In some implementations, the minimum spacing between an edge of a die and a wire is about at least 50 microns (µm).

Figure 4:
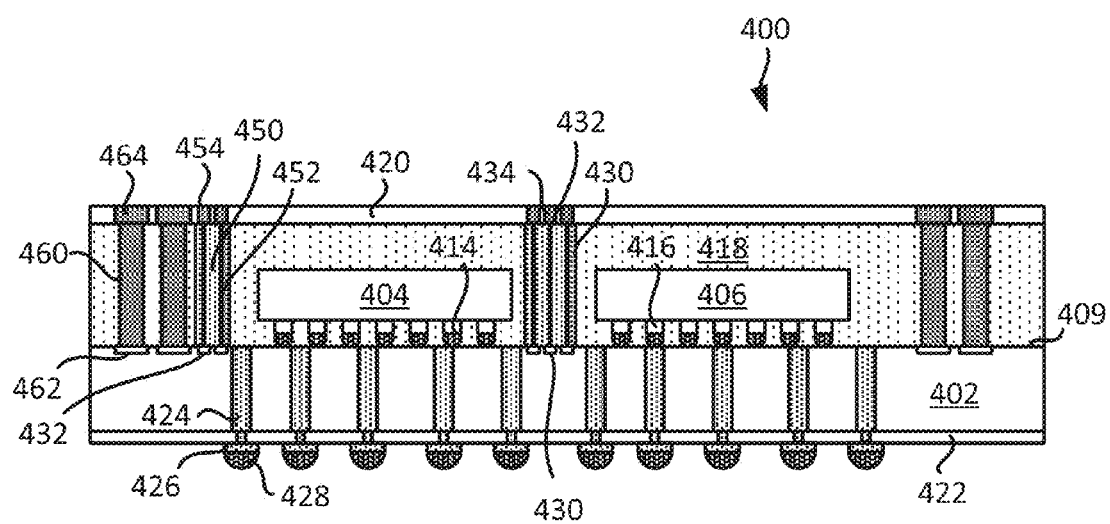
FIG. 4 illustrates an example of an integrated device that includes vias and wires in an encapsulation layer, where the wires are configured to operate as vias.

In some implementations, wires as vias in an encapsulation layer may be implemented with vias in the encapsulation layer. FIG. 4 illustrates an integrated package device 400 that includes wires as vias in an encapsulation layer. In some implementations, the integrated package device 400 is a package in a package on package (PoP) device. As shown in FIG. 4, the integrated package device 400 includes a substrate 402, a first die 404, a second die 406, a first set of interconnects 414, a second set of interconnects 416, a first encapsulation layer 418, a first dielectric layer 420, a second dielectric layer 422, a set of through substrate vias (TSVs) 424, a third set of interconnects 426, a set of solder balls 428, a first set of pads 430, a second set of pads 432, a second encapsulation layer 440, a first set of wires 442, a third set of pads 444, a third encapsulation layer 450, a second set of wires 452, a fourth set of pads 446, a set of vias 460, a fifth set of pads 462, and a sixth set of pads 464. Although not shown for the purpose of clarity, the substrate 402 may include a set of interconnects (e.g., traces and vias). The set of interconnects may couple to other interconnects, such as the second set of pads 432 and/or the first set of interconnects 414 in some implementations.

The first die 404 is coupled the substrate 402 through the first set of interconnects 414 (e.g., first bump, first pillar interconnect, first solder). The second die 406 is coupled the substrate 402 through the second set of interconnects 416 (e.g., second bump, second pillar interconnect, second solder). The first encapsulation layer 418 covers the first and second dies 404 and 406.

As further shown in FIG. 4, the second encapsulation layer 440 and the third encapsulation layer 450 are located in the first encapsulation layer 418. In some implementations, the second encapsulation layer 440 and the third encapsulation layer 450 traverse the first encapsulation layer 418. The second encapsulation layer 440 includes a first set of wires 442. The third encapsulation layer 450 includes a second set of wires 452. In some implementations, the first set of wires 442 and the second set of wires 452 are wire bonds. Different implementations may use similar or different materials for the encapsulation layers (e.g., encapsulation layers 418, 440, 450). In some implementations, an encapsulation layer may include one of at least a mold, a fill, and/or a polymer material.

The first set of wires 442 is coupled to the first set of pads 430. The first set of pads 430 is located in the substrate 402. In some implementations, the first set of pads 430 may be located on the surface of the substrate 402. In some implementations, the first set of pads 430 may be located in the first encapsulation layer 418. The second set of wires 452 is coupled to the second set of pads 432. The second set of pads 432 is located in the substrate 402. In some implementations, the second set of pads 432 may be located on the surface of the substrate 402. In some implementations, the second set of pads 432 may be located in the first encapsulation layer 418.

The first set of vias 460 traverses the first encapsulation layer 418. In some implementations, the first set of vias 460 is a set of through encapsulation vias (TEV). The first set of vias 460 is coupled to the fifth set of pads 462 and the sixth set of pads 464. The fifth set of pads 462 is located in the substrate 402. In some implementations, the fifth set of pads 462 may be located in the first encapsulation layer 418.

In some implementations, the first set of pads 430, the second set of pads 432, and/or the fifth set of pads 462 are coupled to at least one of the set of TSVs 424. In some implementations, at least one of the TSV from the set of TSVs 424 may be coupled to the third set of interconnects 426. At least one interconnect from the third set of interconnects 426 may be coupled to a solder ball from the set of solder balls 428. The second dielectric layer 422 is coupled to a surface (e.g., bottom surface) of the substrate 402. In some implementations, the third set of interconnects 426 may traverse the second dielectric layer 422.

The first dielectric layer 420 is coupled to a surface of the first encapsulation layer 418. The first dielectric layer 420 includes the third set of pads 444 and the fourth set of pads 454. The third set of pads 444 is coupled to the first set of wires 442. The fourth set of pads 454 is coupled to the second set of wires 452.

In some implementations, a dielectric layer 409 is coupled (e.g., formed) on the first surface of the substrate 402. In some implementations, the encapsulation layer 418 is coupled to the dielectric layer 409. In some implementations, the integrated package device 400 is a package in a package-on-package (PoP) device.

Figure 5A:
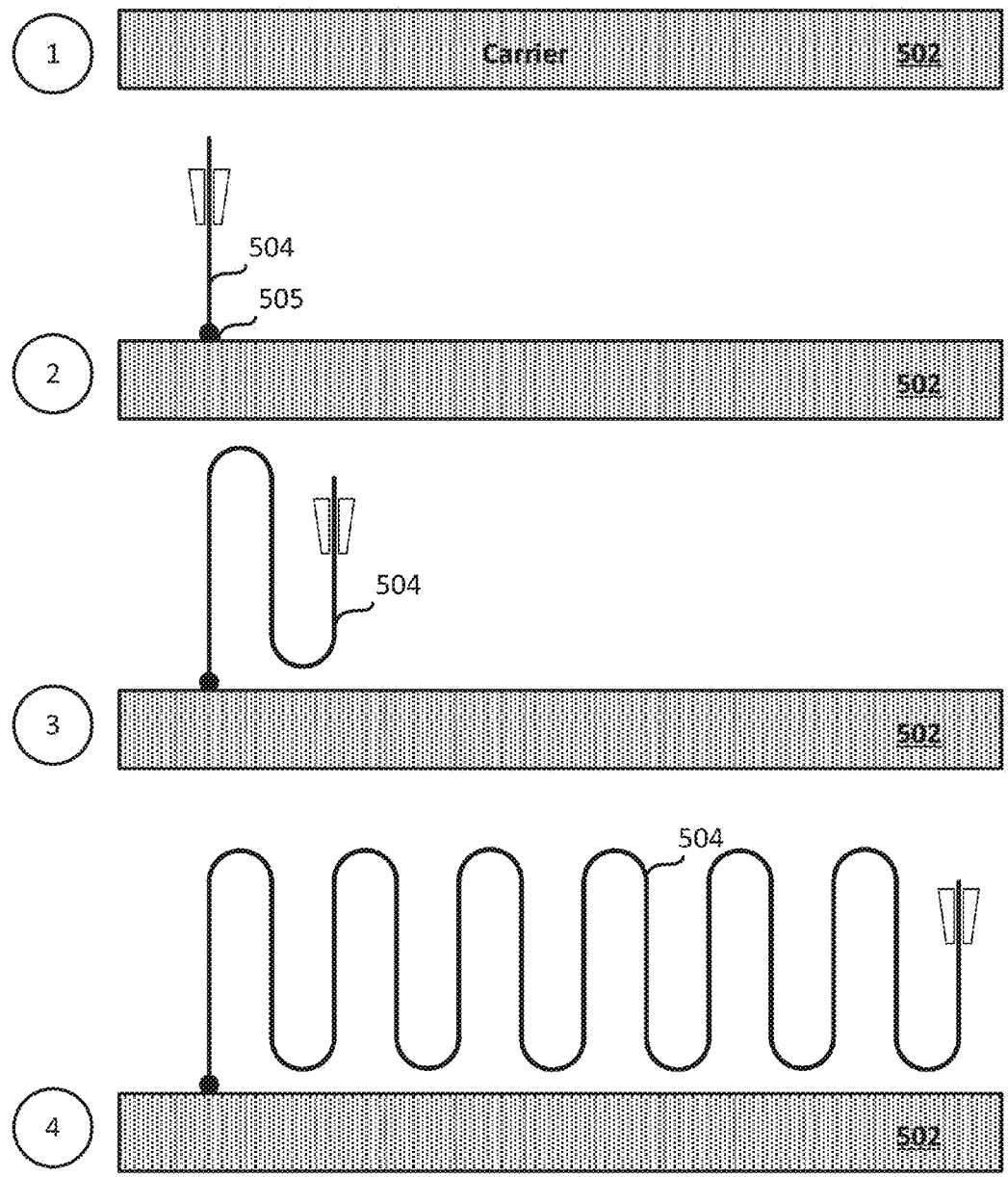
FIG. 5 (comprising FIGS. 5A and 5B) illustrates an exemplary sequence for providing/fabricating an encapsulation layer that includes wires.
Figure 5B:
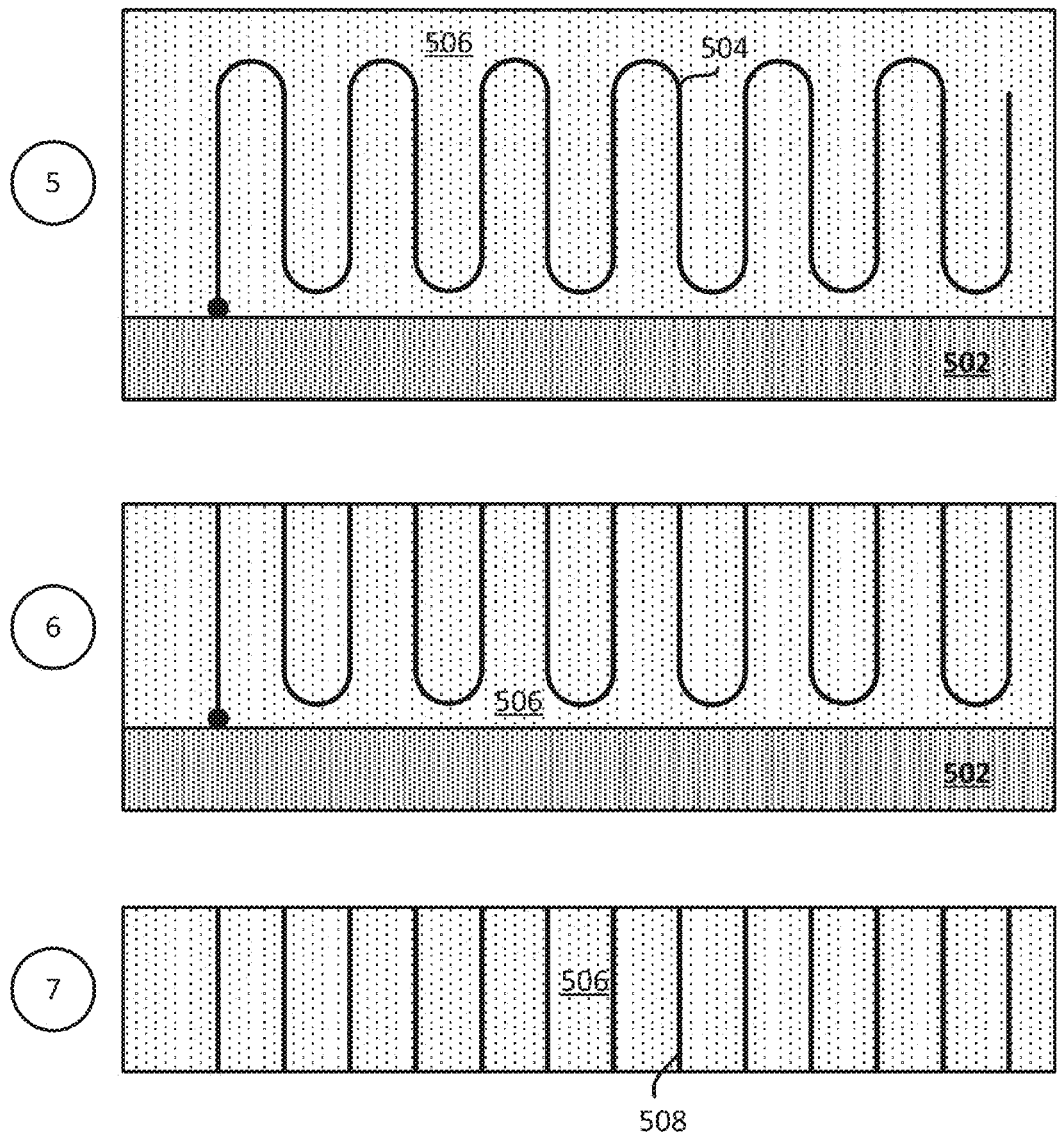

Exemplary Sequence for Providing/Fabricating an Encapsulation Layer that Includes a Set of Vias In some implementations, providing an encapsulation layer that includes a wires as vias includes several processes. FIG. 5 (which includes FIGS. 5A-5B) illustrates an exemplary sequence for providing such an encapsulation layer with vias. In some implementations, the sequence of FIGS. 5A-5B may be used to provide/fabricate the encapsulation layer that includes wires of FIGS. 3, 4, and/or other encapsulation layers described in the present disclose. It should be noted that the sequence of FIGS. 5A-5B may combine one or more stages in order to simplify and/or clarify the sequence for providing an encapsulation layer.

In some implementations, the process of FIGS. 5A-5B illustrates a novel process that provides wires as vias in an encapsulation layer.

As shown in stage 1 of FIG. 5A, a carrier 502 is provided (e.g., fabricated). In some implementations, the carrier 502 is a substrate (e.g., wafer substrate). Different implementations may use different materials for the carrier (e.g., silicon substrate, glass substrate, ceramic substrate, organic substrate, metal plate).

At stage 2, a wire bond 504 is coupled to a surface (e.g., top surface) of the carrier 502. In some implementations, the wire bond 504 is coupled to the carrier 502 through a wire ball 505. In some implementations, the wire ball 505 is a melted wire bond. Stage 2 shows that the wire bond 504 is drawn out from a device or machine that provides a wire bond. In this example, the wire bond 504 is drawn out such that the wire bond 504 is approximately perpendicular to the surface of the carrier 502. However, different implementations may draw out the wire bond 504 along different directions.

Stage 3 illustrates the wire bond 504 being further drawn out up, down, and sideways along the surface of the carrier 502.

Stage 4 illustrates the wire bond 504 being drawn out several times up, down, and sideways along the surface of the carrier 502.

Stage 5 of FIG. 5B, illustrates an encapsulation layer 506 being provided (e.g., formed) over the wire bond 504. Different implementations may use different materials for the encapsulation layer 506. For example, the encapsulation layer 506 may include one of at least a mold, a fill, liquid, powder, film formation, and/or a polymer material.

Stage 6 illustrates a portion of the encapsulation layer 506 and/or portions of the wire bond 504 being removed. In some implementations, removing the encapsulation layer 506 includes removing a first portion (e.g., top portion) of the encapsulation layer 506. In some implementations, removing the encapsulation layer 506 and/or portions of the wire bond 504 includes grinding and/or polishing portions of the encapsulation layer 506 and/or portions of the wire bond 504 to be exposed.

Stage 7 illustrates the carrier 502, at least a second portion (e.g., bottom portion) of the encapsulation layer 506, and at least a portion of the wire bond 504 being removed. Stage 7 also illustrates that the wire ball 505 is removed. In some implementations, removing the carrier 502, at least a second portion (e.g., bottom portion) of the encapsulation layer 506, and at least a portion of the wire bond 504 includes grinding and/or polishing the carrier 502, portions of the encapsulation layer 506, and a portion of the wire bond 504. In some implementations, stage 7 illustrates the wire bond 504 being configured as a set of wires 508 in an encapsulation layer 506 and exposed, where the set of wires 508 are configured to operate as vias. In some implementations, the set of wires 508 are through encapsulation wires (TEWs). In some implementations, the encapsulation layer 506 that includes the set of wires 508 may be implemented in an integrated device, such as the integrated devices 300 and/or 400, as shown in FIGS. 3 and 4.

In some implementations, the carrier 502 and/or portions of the encapsulation layer 506 is not removed until the encapsulation layer 506 is positioned in an encapsulation layer of an integrated device.

Stage 7 also illustrates that the set of wires 508 are approximately linear and perpendicular to a surface (e.g., top surface, bottom surface) of the encapsulation layer 506. However, in some implementations, the set of wires 508 may have different orientation (e.g., non-vertical, diagonal, horizontal), as well as being non-linear. Stage 7 illustrates the set of wires 508 has having approximately the same spacing between wires. However, in some implementations, the spacing between wires in the set of wires 508 may be variable and/or different.

Figure 6A:
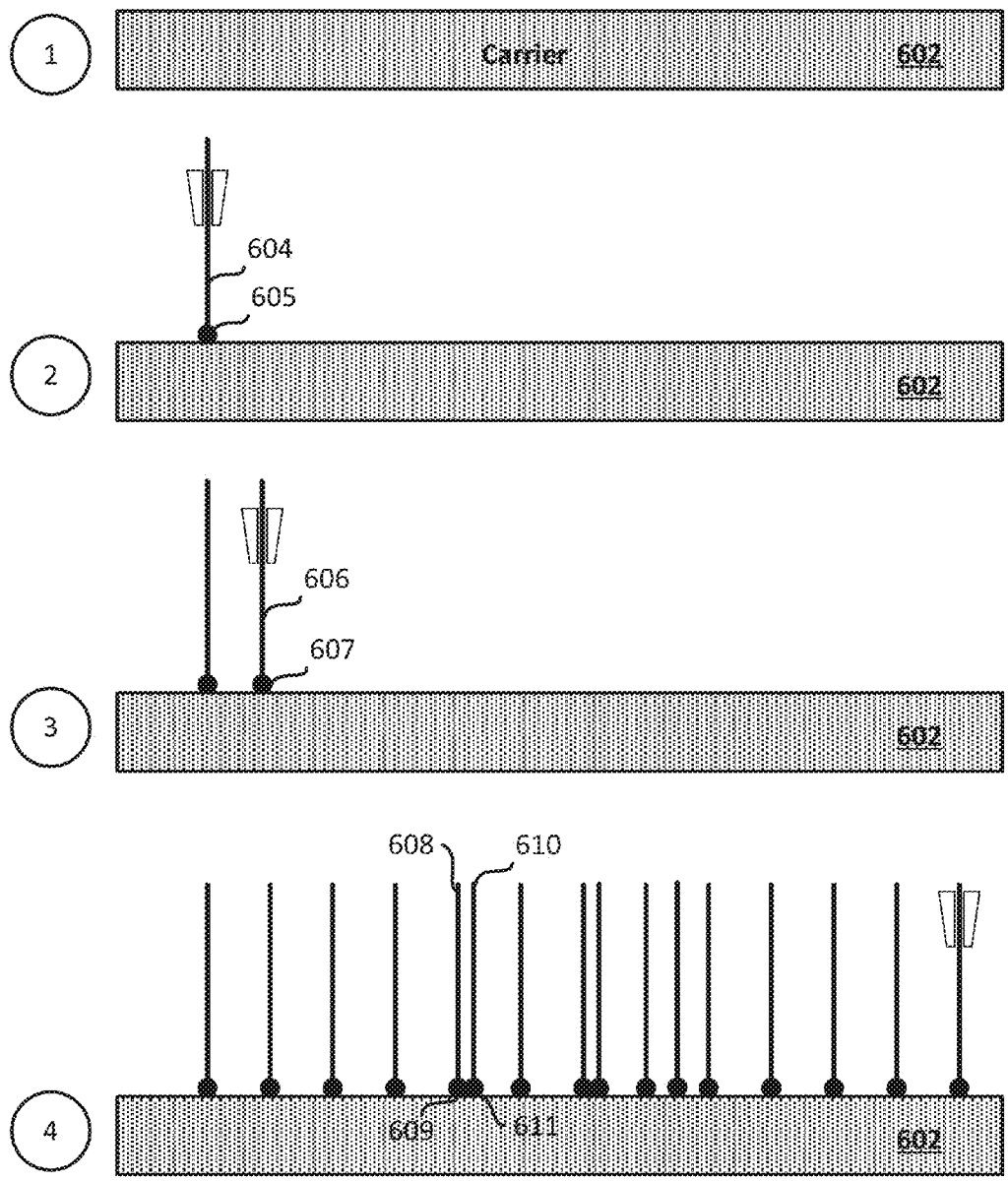
FIG. 6 (comprising FIGS. 6A and 6B) illustrates another exemplary sequence for providing/fabricating an encapsulation layer that includes wires.
Figure 6B:
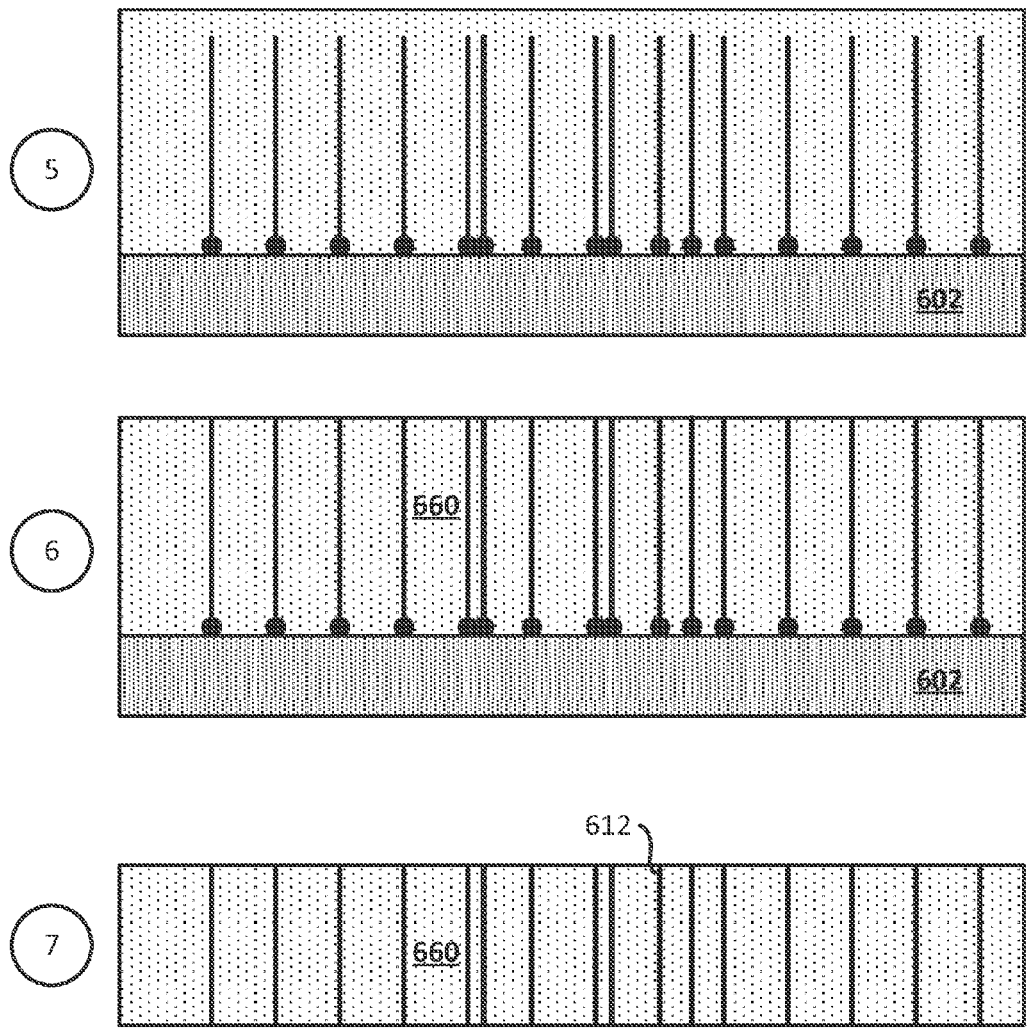

Exemplary Sequence for Providing/Fabricating an Encapsulation Layer that Includes a Set of Vias In some implementations, providing an encapsulation layer that includes a wires as vias includes several processes. FIG. 6 (which includes FIGS. 6A-6B) illustrates an exemplary sequence for providing such an encapsulation layer. In some implementations, the sequence of FIGS. 6A-6B may be used to provide/fabricate the encapsulation layer that includes wires of FIGS. 3, 4, and/or other encapsulation layers described in the present disclose. It should be noted that the sequence of FIGS. 6A-6B may combine one or more stages in order to simplify and/or clarify the sequence for providing an encapsulation layer.

In some implementations, the process of FIGS. 6A-6B illustrates a novel process that provides wires as vias in an encapsulation layer.

As shown in stage 1 of FIG. 6A, a carrier 602 is provided (e.g., fabricated). In some implementations, the carrier 602 is a substrate (e.g., wafer substrate). Different implementations may use different materials for the carrier (e.g., silicon substrate, glass substrate, ceramic substrate, organic substrate).

At stage 2, a first wire bond 604 is coupled to a surface (e.g., top surface) of the carrier 602. In some implementations, the first wire bond 604 is coupled to the carrier 602 through a first wire ball 605. In some implementations, the first wire ball 605 is a melted wire bond. Stage 2 shows that the first wire bond 604 is drawn out from a device or machine that provides a wire bond. In this example, the first wire bond 604 is drawn out such that the first wire bond 604 is approximately perpendicular to the surface of the carrier 602. However, different implementations may draw out the first wire bond 604 along different directions.

At stage 3, a second wire bond 606 is coupled to a surface (e.g., top surface) of the carrier 602. In some implementations, the second wire bond 606 is coupled to the carrier 602 through a second wire ball 607. In some implementations, the second wire ball 607 is a melted wire bond. The second wire bond 606 is drawn out such that the second wire bond 606 is approximately perpendicular to the surface of the carrier 602. However, different implementations may draw out the second wire bond 606 along different directions.

Stage 4 illustrates several wire bonds being drawing out. In particular, stage 4 illustrates a third wire bond 608 and a fourth wire bond 610 coupled to the carrier 602 through a third wire ball 609 and a fourth wire ball 611. Stage 4 illustrates that the third wire ball 609 physically touches the fourth wire ball 611. However, stage 4 illustrates the third wire bond 608 and the fourth wire bond 610 do not directly touch each other. In some implementations, the fact that the third wire ball 609 and the fourth wire ball 611 directly touch each other is not important since they will be subsequently removed. Stage 4 illustrates an advantage of the present process, and that is the ability to provide (e.g., form, fabricate) wires as vias that have smaller spacing (e.g., higher density interconnects) between each other, since the possibility of the wire balls touching is no longer a factor when providing the wires.

Stage 5 of FIG. 6B, illustrates an encapsulation layer 660 being provided (e.g., formed) over the wire bonds (e.g., 604, 606, 608, 610). Different implementations may use different materials for the encapsulation layer 660. For example, the encapsulation layer 660 may include one of at least a mold, a fill, and/or a polymer material.

Stage 6 illustrates a portion of the encapsulation layer 660 and/or portions of the wire bonds (e.g., wire bonds 604, 606, 608) being removed. In some implementations, removing the encapsulation layer 660 includes removing a first portion (e.g., top portion) of the encapsulation layer 660. In some implementations, removing the encapsulation layer 660 and/or portions of the wire bonds (e.g., wire bonds 604, 606, 608) includes grinding and/or polishing portions of the encapsulation layer 660 and/or portions of the wire bonds (e.g., wire bonds 604, 606, 608).

Stage 7 illustrates the carrier 602, at least a second portion (e.g., bottom portion) of the encapsulation layer 660, and at least a portion of the wire bonds (e.g., wire bonds 604, 606, 608) being removed. Stage 7 also illustrates that the wire balls (e.g., wire balls 605, 609, 611) are removed. In some implementations, removing the carrier 602, at least a second portion (e.g., bottom portion) of the encapsulation layer 660, and at least a portion of the wire bonds (e.g., wire bonds 604, 606, 608) includes grinding and/or polishing the carrier 602, portions of the encapsulation layer 660, and a portion of the wire bonds (e.g., wire bonds 604, 606, 608). In some implementations, stage 7 illustrates the wire bond 604 being configured as a set of wires 612 in an encapsulation layer 660, where the set of wires 612 are configured to operate as vias. In some implementations, the set of wires 612 are through encapsulation wires (TEWs). In some implementations, the encapsulation layer 660 that includes the set of wires 612 may be implemented in an integrated device, such as the integrated devices 300 and/or 400, as shown in FIGS. 3 and 4.

In some implementations, the carrier 602 and/or portions of the encapsulation layer 660 is not removed until the encapsulation layer 660 is positioned in an encapsulation layer of an integrated device.

Stage 7 also illustrates that the set of wires 612 are approximately linear and perpendicular to a surface (e.g., top surface, bottom surface) of the encapsulation layer 660. However, in some implementations, the set of wires 612 may have different shapes and orientations (e.g., non-vertical, diagonal, horizontal), as well as being non-linear.

Figure 7:
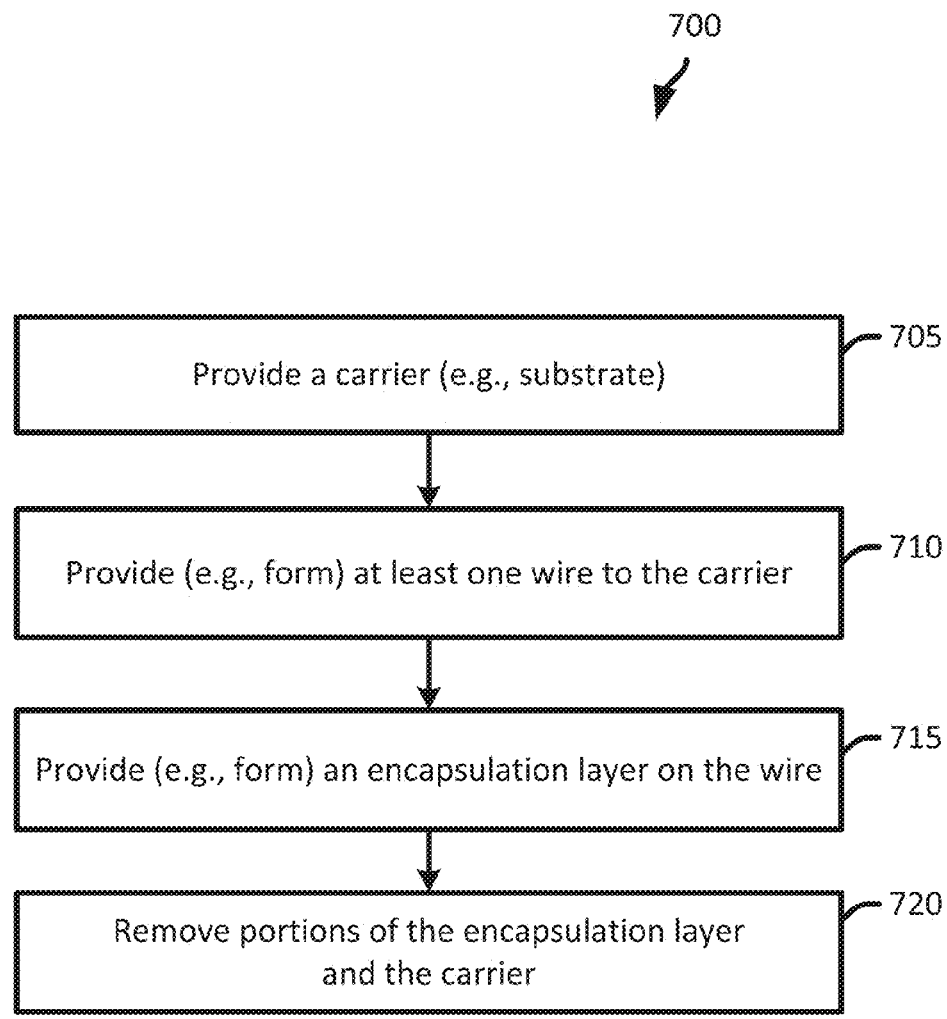
FIG. 7 illustrates a flow diagram of a method for providing/fabricating an encapsulation layer that includes wires.

Exemplary Flow Diagram of a Method for Providing/Fabricating an Encapsulation Layer that Includes a Set of Vias In some implementations, providing an encapsulation layer that includes a wires as vias includes several processes. FIG. 7 illustrates an exemplary flow diagram of a method for providing such an encapsulation layer. In some implementations, the flow diagram may be used to provide/fabricate the encapsulation layer that includes wires of FIGS. 3 and/or 4, and/or other encapsulation layer described in the present disclose. It should be noted that the flow diagram may combine one or more processes in order to simplify and/or clarify the flow diagram of a method for providing an encapsulation layer that includes wires as vias.

The method provides (at 705) a carrier (e.g., carriers 502, 602). In some implementations, providing a carrier includes fabricating or forming a carrier. In some implementations, the carrier is a substrate (e.g., wafer substrate). Different implementations may use different materials for the carrier (e.g., silicon substrate, glass substrate, ceramic substrate, organic substrate).

The method provides (at 710) at least one wire bond on the carrier. Different implementations may provide the wire bonds differently. In some implementations, one continuous wire bond is provided. In some implementations, a first end portion of the wire bond is coupled through a wire ball to the carrier. In some implementations, several wire bonds are provided, which each wire bond coupled to the carrier through a separate wire ball. Different implementations may provide the wire bond(s) along different directions and/or orientations.

The method then provides (at 715) an encapsulation layer is provided over the at least one wire bond. Different implementations may use different materials for the encapsulation layer. In some implementations, the encapsulation layer may include one of at least a mold, a fill, and/or a polymer material.

The method removes (at 720) at least portions of the encapsulation layer, the carrier, and/or the wire bond(s). In some implementations, removing (at 720) at least portions of the encapsulation layer, the carrier, and/or the wire bond(s) includes grinding and/or polishing at least portions of the encapsulation layer, the carrier, and/or the wire bond(s). In some implementations, once at least portions of the encapsulation layer, the carrier, and/or the wire bond(s) are removed, the process leaves behind an encapsulation layer that includes a set of wires as a set of vias in the encapsulation layer. In some implementations, the set of vias are approximately linear and perpendicular to a surface (e.g., top surface, bottom surface) of the encapsulation layer. However, in some implementations, the set of wires may have different orientation (e.g., non-vertical, diagonal, horizontal), as well as being non-linear. In some implementations, the set of vias has having approximately the same spacing between wires. However, in some implementations, the spacing between wires in the set of vias may be variable and/or different.

Exemplary Sequence for Providing/Fabricating Integrated Device that Includes Wires as Vias Traversing an Encapsulation Layer In some implementations, providing an integrated device (e.g., integrated package) that includes wires in an encapsulation layer includes several processes. FIG. 8 (which includes FIGS. 8A-8C) illustrates an exemplary sequence for providing an integrated device. In some implementations, the sequence of FIGS. 8A-8C may be used to provide/fabricate the integrated device of FIGS. 3 and/or 4, and/or other integrated devices described in the present disclose.

It should be noted that the sequence of FIGS. 8A-8C may combine one or more stages in order to simplify and/or clarify the sequence for providing an integrated device that includes wires in an encapsulation layer. In some implementations, the process of FIGS. 8A-8C illustrate a novel process that provides an integrated device with high density interconnects.

As shown in stage 1 of FIG. 8A, a substrate 802 is provided (e.g., fabricated). In some implementations, the substrate 802 is a wafer. Different implementations may use different materials for the substrate (e.g., silicon substrate, glass substrate, ceramic substrate, organic substrate). The substrate 802 includes a set of through substrate vias (TSVs) 804, a first set of pads 805, a second set of pads 807, and a third set of pads 809. In some implementations, the substrate 802 may also include other interconnects (e.g., traces). In some implementations, the first, second, and/or third sets of pads 805, 807, 809 may be embedded in the first surface of the substrate 802. In some implementations, the first, second, and third sets of pads 805, 807 and 809 may be located on a first surface (e.g., top surface) of the substrate 802. In some implementations, a dielectric layer 803 is coupled (e.g., formed) on the first surface of the substrate 802. The dielectric layer 803 may include one or more openings and/or cavities above one or more pads 805, 807, 809 and/or one or more set of TSVs 804. Although not shown for the purpose of clarity, the substrate 802 may include a set of interconnects (e.g., traces and vias). The set of interconnects may couple to other interconnects such as the pads 805, 807, and/or 809 in some implementations.

At stage 2, a first die 806 and a second die 808 are coupled to the substrate 802. The first die 806 is coupled to the substrate 802 through a first set of interconnects 816 (e.g., first pillar, first solder). In some implementations, at least one of the first set of interconnects is electrically coupled to at least one TSV from the set of TSVs 804. The second die 808 is coupled to the substrate 802 through a second set of interconnects 818 (e.g., first pillar, first solder). In some implementations, at least one of the second set of interconnects 818 is electrically coupled to at least one TSV from the set of TSVs 804.

At stage 3, a first encapsulation layer 820 is provided (e.g., formed) on the substrate 802 and/or the dielectric layer 803 on the substrate 802. The encapsulation layer 820 encapsulates the first die 806 and the second die 808. In some implementations, the first encapsulation layer 820 may be coupled directly to the substrate 802. Different implementations may use different materials for the first encapsulation layer 820. In some implementations, the first encapsulation layer 820 is one of at least a mold, fill, and/or polymer material. In some implementations, the first encapsulation layer 820 is made of a material that has a photo-patternable property.

At stage 4, at least one cavity is formed in the first encapsulation layer 820. For example, a first set of cavities 825, a second cavity 827, and a third cavity 829 are formed in the first encapsulation layer 820. In some implementations, each cavity is formed (e.g., created) over a respective set of pads (e.g., pads 805). Different implementations may use different processes for forming the cavity. In some implementations, the cavity is formed by using a photolithography process. In some implementations, the cavity is formed by using a laser process.

At stage 5, as shown in FIG. 8B, a second encapsulation layer 830 and a third encapsulation layer 840 are provided in at least one cavity of the first encapsulation layer 820. Specifically, the second encapsulation layer 830 is provided in the second cavity 827, and the third encapsulation layer 840 is provided in the third cavity 829. It should be noted that the second cavity 827 may be slightly bigger than the second encapsulation layer 830 in order for the second encapsulation layer 830 to fit in the second cavity 827. Similarly, the third cavity 829 may be slightly bigger than the third encapsulation layer 840 in order for the third encapsulation layer 840 to fit in the third cavity 829. Stage 5 also illustrates that the second encapsulation layer 830 includes a first set of wires 832. Stage 5 further illustrates that the third encapsulation layer 840 includes a second set of wires 842. In some implementations, the second encapsulation layer 830 and/or the third encapsulation layer 840 are fabricated using the processes described in FIGS. 5A-5B, and/or 6A-6B. It should be noted that in some implementations, the walls of the cavities may have an angled edge (e.g., non-perpendicular) in order to facilitate the encapsulation layer "sliding into" the cavity. In some implementations, the second encapsulation layer 830 and/or the third encapsulation layer 840 may be coupled to a carrier which may temporarily hold the second encapsulation layer 830 and/or the third encapsulation layer 840. In such instances, the carrier may be removed (e.g., grinded, polished) once the second encapsulation layer 830 and/or the third encapsulation layer 840 is placed in the first encapsulation layer 820.

At stage 6, a first set of vias 850, a first set of pads 852, a second set of pads 854, and a third set of pads 856 are provided. The first set of vias 850 is formed in the first set of cavities 825. The first set of pads 852 is coupled to the first set of vias 850. The second set of pads 854 is coupled to the first set of wires 832 in the second encapsulation layer 830. The third set of pads 856 is coupled to the second set of wires 842 in the third encapsulation layer 840. In some implementations, the first set of vias 850 and the set of pads 852, 854, 856 are metal layers. Different implementations may form the first set of vias, and the set of pads 852, 854, and/or 856 differently.

In some implementations, the first set of vias and the set of pads 852, 854 and/or 856 may include a first metal layer and a seed layer. In some implementations, a plating process is used to form the seed layer. The seed layer may cover the inside walls of the cavities (e.g., set of cavities 825), at least part of the pads 805, and/or the first surface of the encapsulation layer 820. Different implementations may use different materials for the seed layer.

Once a seed layer is provided, in some implementations, a photo resist layer is provided and selectively removed (e.g., etched). Next, a first metal layer is provided (e.g., formed, deposited) on the seed layer. In some implementations, the first metal layer is provided on the seed layer that is not covered by the photo resist layer. In some implementations, a lithography and plating process is used to provide the first metal layer on the seed layer. In some implementations, the first metal layer and the seed layer are the same material. Thus, in some implementations, the first metal layer may include the first seed layer. In some implementations, the photo resist layer, and the seed layer may be selectively removed (e.g., etched). In some implementations, the photo resist layer and the seed layer are removed concurrently. In some implementations, the photo resist layer and the seed layer are removed sequentially.

At stage 7, a dielectric layer 860 is optionally provided (e.g., formed) on a second surface of the encapsulation layer 820.

At stage 8, another dielectric layer 870 is optionally provided (e.g., formed) on the second surface (e.g., bottom surface) of the substrate 802. In addition, a set of interconnects 872 are also provided on/in the dielectric layer 870. In some implementations, the set of interconnects 872 includes at least one of a redistribution layer and/or an under bump metallization (UBM) layer. In some implementations, at least one interconnect from the set of interconnects 872 is electrically coupled to at least one TSV from the set of TSVs 804.

At stage 9, a set of solder balls 874 is coupled to the set of interconnects 872. In some implementations, after stage 9, an integrated device 880 is fabricated that includes wires in an encapsulation layer.

Exemplary Flow Diagram of a Method for Providing/Fabricating Integrated Device that Includes Wires as Vias Traversing an Encapsulation Layer In some implementations, providing an integrated device (e.g., integrated package) that includes wires in an encapsulation layer includes several processes. FIG. 9 illustrates an exemplary flow diagram of a method for providing an integrated device. In some implementations, the flow diagram may be used to provide/fabricate the integrated device of FIGS. 3 and/or 4, and/or other integrated devices described in the present disclose.

It should be noted that the flow diagram of FIG. 9 may combine one or more stages in order to simplify and/or clarify the sequence for providing an integrated device that includes wires in an encapsulation layer. In some implementations, the flow diagram illustrates a novel process that provides an integrated device with high density interconnects.

The method provides (at 905) a substrate. In some implementations, the substrate is a wafer. Different implementations may use different materials for the substrate (e.g., silicon substrate, glass substrate, ceramic substrate, organic substrate). The substrate may include a set of through substrate vias (TSVs), a first set of pads, a second set of pads, and a third set of pads. In some implementations, the substrate may also include other interconnects (e.g., traces). In some implementations, the first, second, and/or third sets of pads may be embedded in the first surface of the substrate. In some implementations, the first, second, and third sets of pads may be located on a first surface (e.g., top surface) of the substrate. In some implementations, a dielectric layer may be coupled (e.g., formed) on the first surface of the substrate. The dielectric layer may include one or more openings and/or cavities above one or more pads and/or one or more set of TSVs.

The method then provides (at 910) at least one die on the substrate. In some implementations, providing at least one die include coupling a die to a surface of the substrate. In some implementations, the die is coupled to the substrate through a set of interconnects (e.g., first pillar, first solder). In some implementations, at least one interconnect from the set of interconnects is electrically coupled to at least one TSV from the set of TSVs.

The method further provides (at 915) a first encapsulation layer on the die. In some implementations, the first encapsulation layer is provided (e.g., formed) over the die and the substrate. Different implementations may use different materials for the first encapsulation layer. In some implementations, the first encapsulation layer is one of at least a mold, fill, and/or polymer material. In some implementations, the first encapsulation layer is made of a material that has a photo-patternable property.

The method provides (at 920) a second encapsulation layer in the first encapsulation layer. The second encapsulation layer includes a set of wires. In some implementations, providing the second encapsulation layer includes forming a cavity in the first encapsulation layer and position the second encapsulation layer in the cavity of the first encapsulation layer. In some implementations, each cavity is formed (e.g., created) over a respective set of pads. Different implementations may use different processes for forming the cavity. In some implementations, the cavity is formed by using a photolithography process. In some implementations, the cavity is formed by using a laser process. In some implementations, the cavity is slightly larger than the second encapsulation layer in order for the second encapsulation layer to fit in the cavity. In some implementations, the second encapsulation layer is fabricated using the processes described in FIGS. 5A-5B, and/or 6A-6B. It should be noted that in some implementations, the walls of the cavity may have an angled edge (e.g., non-perpendicular) in order to facilitate the encapsulation layer "sliding into" the cavity.

The method optionally provides (at 925) at set of vias in the first encapsulation layer. In some implementations, providing the first set of vias includes forming a set of cavities in the first encapsulation layer and filling the set of cavities with at least one metal layer. Different implementations may form the first set of vias differently. In some implementations, the first set of vias may include a first metal layer and a seed layer. In some implementations, a plating process is used to form the seed layer. The seed layer may cover the inside walls of the cavities. Different implementations may use different materials for the seed layer.

Once a seed layer is provided, in some implementations, a photo resist layer is provided and selectively removed (e.g., etched). Next, a first metal layer is provided (e.g., formed, deposited) on the seed layer. In some implementations, the first metal layer is provided on the seed layer that is not covered by the photo resist layer. In some implementations, a lithography and plating process is used to provide the first metal layer on the seed layer. In some implementations, the first metal layer and the seed layer are the same material. Thus, in some implementations, the first metal layer may include the first seed layer. In some implementations, the photo resist layer, and the seed layer may be selectively removed (e.g., etched). In some implementations, the photo resist layer and the seed layer are removed concurrently. In some implementations, the photo resist layer and the seed layer are removed sequentially, which leaves behind the set of vias in the first encapsulation layer.

In some implementations, the method may optionally provide (e.g., form) a dielectric layer on a second surface of the encapsulation layer. In some implementations, the method may also provide another dielectric layer provide (e.g., form) on the second surface (e.g., bottom surface) of the substrate. In addition, a set of interconnects may also be provided on/in the dielectric layer. In some implementations, the set of interconnects includes at least one of a redistribution layer and/or an under bump metallization (UBM) layer. In some implementations, at least one interconnect from the set of interconnects is electrically coupled to at least one TSV from the set of TSVs. In some implementations, a set of solder balls is coupled to the set of interconnects.

Exemplary Electronic Devices

FIG. 10 illustrates various electronic devices that may be integrated with any of the aforementioned integrated device, semiconductor device, integrated circuit, die, interposer or package. For example, a mobile telephone 1002, a laptop computer 1004, and a fixed location terminal 1006 may include an integrated device 1000 as described herein. The integrated device 1000 may be, for example, any of the integrated devices, integrated circuits, dice or packages described herein. The devices 1002, 1004, 1006 illustrated in FIG. 10 are merely exemplary. Other electronic devices may also feature the integrated device 1000 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 3, 4, 5A-5B, 6A-6B, 7, 8A-8C, 9, and/or 10 may be rearranged and/or combined into a single component, step, feature or function or embodied in several components, steps, or functions. Additional elements, components, steps, and/or functions may also be added without departing from the disclosure. It should also be noted that FIGS. 3, 4, 5A-5B, 6A-6B, 7, 8A-8C, 9, and/or 10 and its corresponding description in the present disclosure is not limited to integrated device, dies and/or ICs. In some implementations, FIGS. 3, 4, 5A-5B, 6A-6B, 7, 8A-8C, 9, and/or 10 and its corresponding description may be used to manufacture, create, provide, and/or produce integrated devices. In some an integrated device may include a die package, an integrated circuit (IC), a wafer, a semiconductor device, package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a substrate;
   a first die coupled to the substrate;
   a first encapsulation layer coupled to the substrate and the first die; and
   a second encapsulation layer in the first encapsulation layer, the second encapsulation layer comprising a set of wires configured to operate as vias.

2. The integrated device of claim 1, further comprising a set of vias in the first encapsulation layer.

3. The integrated device of claim 1, further comprising a second die coupled to the substrate.

4. The integrated device of claim 3, wherein the second encapsulation layer is positioned between the first die and the second die.

5. The integrated device of claim 1, further comprising a cavity in the first encapsulation layer, wherein the second encapsulation layer is positioned in the cavity.

6. The integrated device of claim 5, wherein the cavity has a wall that is non-vertical.

7. The integrated device of claim 1, wherein at least one of the wires is non-vertical.

8. The integrated device of claim 1, wherein at least one of the wires is free of a wire ball.

9. The integrated device of claim 1, wherein the integrated device comprises one of at least a package device, and/or a package-on-package (PoP) device.

10. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

11. The integrated device of claim 1, wherein spacing between wires in the set of wires is approximately 20 μm.

12. The integrated device of claim 1, wherein spacing between an edge of the die and a wire in the set of wires is approximately 50 μm.

13. The integrated device of claim 1, wherein the set of wires includes at least one wire bond.

14. A method for providing an integrated device, comprising:
   forming a substrate;
   coupling a first die to the substrate;
   forming a first encapsulation layer on the substrate and the first die; and
   forming a second encapsulation layer in the first encapsulation layer, the second encapsulation layer comprising a set of wires configured to operate as vias.

15. The method of claim 14, further comprising forming a set of vias in the first encapsulation layer.

16. The method of claim 14, further comprising coupling a second die to the substrate.

17. The method of claim 16, wherein the second encapsulation layer is positioned between the first die and the second die.

18. The method of claim 14, further comprising forming a cavity in the first encapsulation layer, wherein forming the second encapsulation layer comprises positioning the second encapsulation layer in the cavity.

19. The method of claim 18, wherein the cavity has a wall that is non-vertical.

20. The method of claim 14, wherein at least one of the wires is non-vertical.

21. The method of claim 14, wherein at least one of the wires is free of a wire ball.

22. The method of claim 14, wherein the integrated device comprises one of at least a package device, and/or a package-on-package (PoP) device.

23. The method of claim 14, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

24. The method of claim 14, wherein the forming the second encapsulation layer in the first encapsulation layer further includes:
   forming the set of wires; and
   forming the second encapsulation layer over the set of wires.

25. The method of claim 14, wherein the forming the second encapsulation layer in the first encapsulation layer further includes:
   providing a carrier;
   forming the set of wires on a surface of the carrier such that the set of wires are perpendicular to the surface of the carrier;
   forming the second encapsulation layer over the set of wires; and
   removing the carrier.

26. The method of claim 25, wherein the forming the set of wires on the surface of the carrier further includes:
   coupling a first wire bond to the surface of the carrier;
   drawing the wire bond out perpendicular to the surface of the carrier;
   coupling at least one additional wire bond to the surface of the carrier; and
   drawing out the at least one additional wire bond perpendicular to the surface of the carrier to form the set of wires.

27. The method of claim 25, wherein the forming the second encapsulation layer in the first encapsulation layer further includes:
   coupling a wire bond to the surface of the carrier;
   drawing the wire bond out perpendicular to the surface of the carrier to a first distance from the surface of the carrier;
   drawing the wire bond further out along the surface of the substrate in a winding pattern between the first distance and a second distance from the carrier that is less than the first distance;
   forming the second encapsulation layer over the wire bond; and
   removing the carrier and at least a portion of the second encapsulation layer to form the set of wires within the second encapsulation layer.

* * * * *